United States Patent
Onuki et al.

(10) Patent No.: US 9,640,255 B2
(45) Date of Patent: *May 2, 2017

(54) SEMICONDUCTOR DEVICE AND DRIVING METHOD OF SEMICONDUCTOR DEVICE

(71) Applicant: Semiconductor Energy Laboratory Co., Ltd., Atsugi-shi, Kanagawa-ken (JP)

(72) Inventors: Tatsuya Onuki, Kanagawa (JP); Wataru Uesugi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/081,998

(22) Filed: Mar. 28, 2016

(65) Prior Publication Data

US 2016/0284407 A1    Sep. 29, 2016

Related U.S. Application Data

(63) Continuation of application No. 13/889,957, filed on May 8, 2013, now Pat. No. 9,299,432.

(30) Foreign Application Priority Data

May 11, 2012  (JP) .................................. 2012-109295
Jan. 24, 2013  (JP) .................................. 2013-010793

(51) Int. Cl.
*G11C 5/06*    (2006.01)
*G11C 14/00*   (2006.01)
*G11C 5/10*    (2006.01)

(52) U.S. Cl.
CPC .......... *G11C 14/0054* (2013.01); *G11C 5/063* (2013.01); *G11C 5/10* (2013.01)

(58) Field of Classification Search
CPC ........ G11C 14/0054; G11C 5/063; G11C 5/10
See application file for complete search history.

(56) References Cited

U.S. PATENT DOCUMENTS 4,809,225 A    2/1989 Dimmler et al.
5,731,856 A    3/1998 Kim et al.
(Continued)

FOREIGN PATENT DOCUMENTS

EP    0297777 A    1/1989
EP    0530928 A    3/1993
(Continued)

OTHER PUBLICATIONS

Matsuzaki.T et al., "1Mb Non-Volatile Random Access Memory Using Oxide Semiconductor", IMW 2011 (3rd IEEE International Memory Workshop), May 22, 2011, pp. 185-188.

(Continued)

*Primary Examiner* — Richard Elms
*Assistant Examiner* — Mohammed A Bashar
(74) *Attorney, Agent, or Firm* — Fish & Richardson P.C.

(57) ABSTRACT

To provide a semiconductor device including a volatile memory which achieves high speed operation and lower power consumption. For example, the semiconductor device includes an SRAM provided with first and second data holding portions and a non-volatile memory provided with third and fourth second data holding portions. The first data holding portion is electrically connected to the fourth data holding portion through a transistor. The second data holding portion is electrically connected to the third data holding portion through a transistor. While the SRAM holds data, the transistor is on so that both the SRAM and the non-volatile memory hold the data. Then, the transistor is turned off before supply of power is stopped, so that the data becomes non-volatile.

14 Claims, 7 Drawing Sheets

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,314,637 | B2 | 11/2012 | Kato et al. |
| 8,362,538 | B2 | 1/2013 | Koyama et al. |
| 8,410,838 | B2 | 4/2013 | Kato et al. |
| 8,432,187 | B2 | 4/2013 | Kato et al. |
| 8,618,586 | B2 | 12/2013 | Koyama et al. |
| 9,407,269 | B2 | 8/2016 | Koyama et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0125644 | A1 | 7/2004 | Komatsuzaki |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0023503 | A1 | 2/2006 | Lee |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308805 | A1 | 12/2008 | Akimoto et al. |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0136743 | A1 | 6/2010 | Akimoto et al. |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |
| 2011/0163311 | A1 | 7/2011 | Akimoto et al. |
| 2013/0057315 | A1 | 3/2013 | Kato et al. |
| 2013/0301332 | A1 | 11/2013 | Onuki |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-108402 A | 4/2007 |
| JP | 2007-123861 A | 5/2007 |
| JP | 2011-151796 A | 8/2011 |
| WO | WO-2004/114391 | 12/2004 |
| WO | WO-2011/078373 | 6/2011 |

OTHER PUBLICATIONS

Asakuma.N et al., "Crystallization and Reduction of Sol-Gel-Derived Zinc Oxide Films by Irradiation With Ultraviolet Lamp",

(56) References Cited

OTHER PUBLICATIONS

Journal of Sol-Gel Science and Technology, 2003, vol. 26, pp. 181-184.
Asaoka.Y et al., "29.1:Polarizer-Free Reflective LCD Combined With Ultra Low-Power Driving Technoloogy", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1236.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Appplication", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 22317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUs on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (m=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, pp. 899-902.

Oba.F et al., "Defect energetics in ZnO: A hybrid Hartree-Fock density functional study", Phys. Rev. B. Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technolgy B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

SEMICONDUCTOR DEVICE AND DRIVING METHOD OF SEMICONDUCTOR DEVICE

CROSS-REFERENCE TO RELATED APPLICATIONS

This application is a continuation of U.S. application Ser. No. 13/889,957, filed May 8, 2013, now allowed, which claims the benefit of foreign priority applications filed in Japan as Serial No. 2012-109295 on May 11, 2012 and Serial No. 2013-010793 on Jan. 24, 2013, all of which are incorporated by reference.

BACKGROUND OF THE INVENTION

1. Field of the Invention

The present invention relates to a semiconductor device and a driving method of the semiconductor device. In this specification, a semiconductor device refers to a semiconductor element itself or a device including a semiconductor element. As such a semiconductor element, a transistor is given, for example. Accordingly, the semiconductor device includes liquid crystal display devices, memory devices, and the like.

2. Description of the Related Art

As one kind of volatile memory, a static random access memory (SRAM) is widely known. For example, Patent Document 1 discloses a semiconductor integrated circuit in which data in an SRAM is saved in an external context holding portion, leading to lower power consumption and shorter starting time.

Meanwhile, in recent years, a metal oxide having semiconductor characteristics (hereinafter referred to as an oxide semiconductor) has attracted attention. Oxide semiconductors can be applied to transistors (Patent Documents 2 and 3).

REFERENCE

Patent Document

[Patent Document 1] Japanese Published Patent Application No. 2007-108402
[Patent Document 2] Japanese Published Patent Application No. 2007-123861
[Patent Document 3] Japanese Published Patent Application No. 2007-096055

SUMMARY OF THE INVENTION

One object of one embodiment of the present invention is to provide a memory device (semiconductor device) which includes a data holding portion electrically connected to a transistor having low off-state current and a volatile memory (e.g., an SRAM) electrically connected to the data holding portion.

Another object of one embodiment of the present invention is to provide a driving method of the memory device (semiconductor device) in which the volatile memory (e.g., an SRAM) can operate at high speed. Another object of one embodiment of the present invention is to provide a driving method of the memory device (semiconductor device) which has lower power consumption in save operation performed just before supply of power is stopped.

Another embodiment of the present invention is a semiconductor device in which a data holding portion of a volatile memory is electrically connected to a data holding portion of a non-volatile memory through a transistor. In the case of driving this semiconductor device, the transistor is turned off when data is written to the volatile memory. Accordingly, writing to the volatile memory can be performed at high speed. While the volatile memory holds data, the transistor is on so that both the volatile memory and the non-volatile memory hold the data. Then, the transistor is turned off before supply of power is stopped, so that the data becomes non-volatile. Whether power is supplied or not is determined in each element or in each block.

Another embodiment of the present invention is a semiconductor device which includes a plurality of the memory elements arranged in matrix each including a first memory provided with first and second data holding portions and a second memory provided with third and fourth data holding portions. The first data holding portion is electrically connected to a bit line through a first transistor. The second data holding portion is electrically connected to an inverted bit line through a second transistor. A first word line is electrically connected to the first and second transistors. The third data holding portion is electrically connected to the second data holding portion through a third transistor. The fourth data holding portion is electrically connected to the first data holding portion through a fourth transistor. A second word line is electrically connected to the third and fourth transistors. The third data holding portion is electrically connected to one electrode of a capacitor, and the fourth data holding portion is electrically connected to one electrode of another capacitor. The other electrodes of the two capacitors are electrically connected to a low potential power supply line. The third and fourth transistors are turned off just before supply of power to the first memory is stopped.

Another embodiment of the present invention is a driving method of the semiconductor device, which includes the following steps. While the first and second transistors are on and at the same time the third and fourth transistors are off, data from the bit line and data from the inverted bit line are held in the first and second data holding portions; and, while the third and fourth transistors are on and at the same time the first and second transistors are off, data in the first data holding portion and data in the second data holding portion are held in the fourth and third data holding portions.

A memory device (semiconductor device) which includes a data holding portion connected to a transistor having low off-state current and a volatile memory connected to the data holding portion can be provided.

The memory device (semiconductor device) can operate at high speed. Further, the memory device (semiconductor device) can have lower power consumption in save operation performed just before supply of power to the volatile memory is stopped.

DETAILED DESCRIPTION OF THE INVENTION

Hereinafter, embodiments of the present invention are described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

In this embodiment, a semiconductor device and a driving method of the semiconductor device that are embodiments of the present invention are described.

Figure 1:
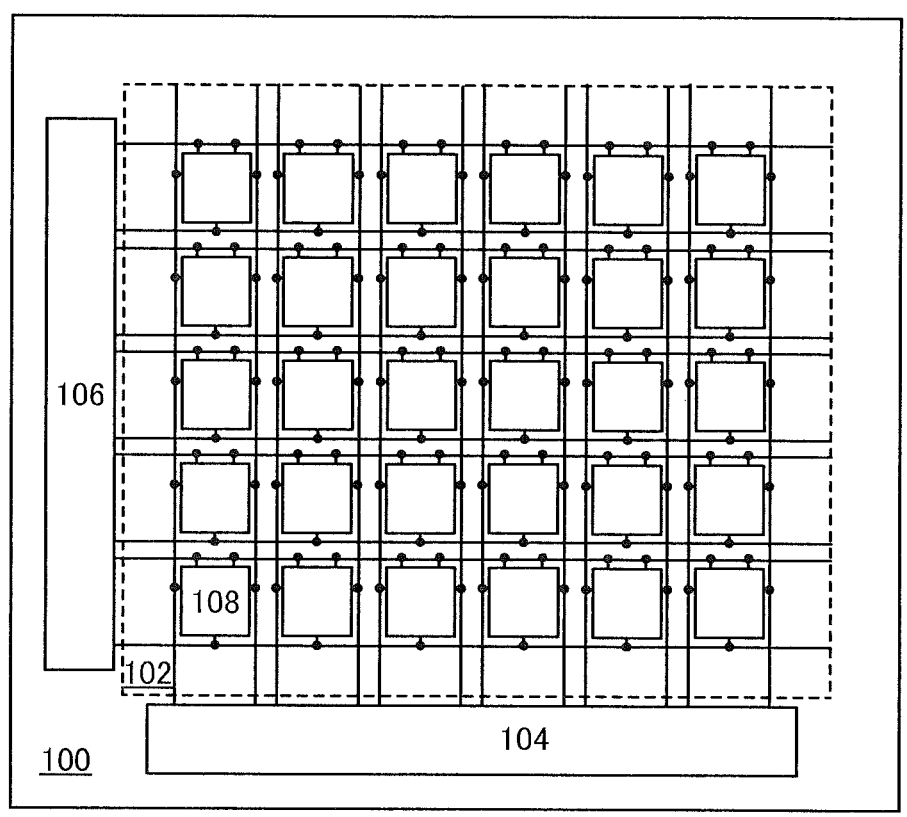
FIG. 1 is a block diagram illustrating a semiconductor device that is one embodiment of the present invention.

As the semiconductor device that is one embodiment of the present invention, a memory device 100 is illustrated in FIG. 1. The memory device 100 illustrated in FIG. 1 includes a memory element portion 102, a first driver circuit 104, and a second driver circuit 106.

A plurality of memory elements 108 are arranged in matrix in the memory element portion 102. In the example illustrated in FIG. 1, the memory elements 108 are arranged in five rows and six columns in the memory element portion 102.

The first driver circuit 104 and the second driver circuit 106 control supply of signals to the memory elements 108, and obtain signals from the memory elements 108 in reading. For example, the first driver circuit 104 serves as a word line driver circuit and the second driver circuit 106 serves as a bit line driver circuit. However, one embodiment of one embodiment of the present invention is not limited thereto, and the first driver circuit 104 may serve as a bit line driver circuit and the second driver circuit 106 may serve as a word line driver circuit.

The first driver circuit 104 and the second driver circuit 106 are each electrically connected to the memory elements 108 by wirings.

Figure 2:
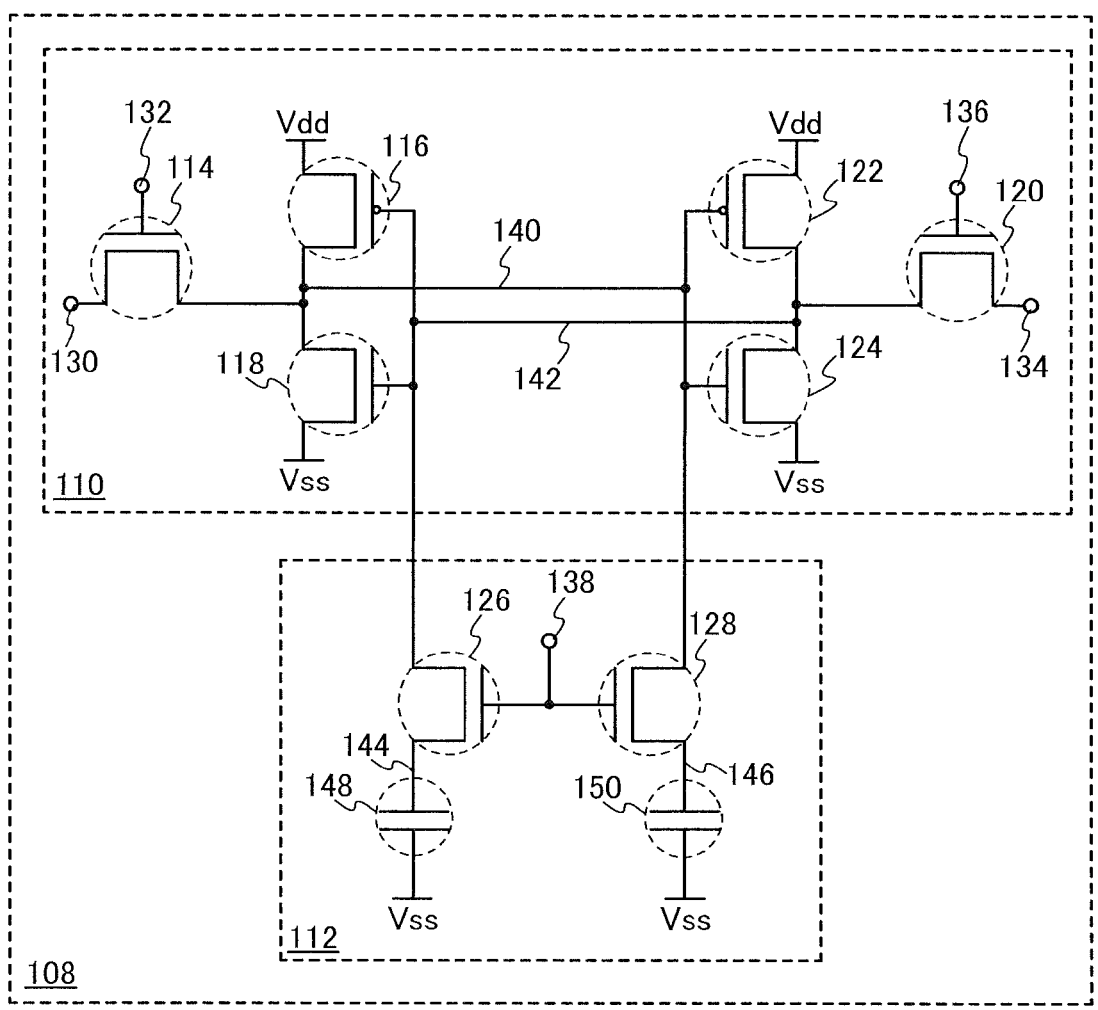
FIG. 2 is a circuit diagram illustrating a semiconductor device that is one embodiment of the present invention.

The memory elements 108 each include a volatile memory and a non-volatile memory. FIG. 2 illustrates a specific example of a circuit configuration of the memory element 108. The memory element 108 illustrated in FIG. 2 includes a first memory circuit 110 and a second memory circuit 112.

The first memory circuit 110 includes a first transistor 114, a second transistor 116, a third transistor 118, a fourth transistor 120, a fifth transistor 122, and a sixth transistor 124.

First, a configuration of the first memory circuit 110 is described. One of a source and a drain of the first transistor 114 is electrically connected to a first terminal 130, and a gate of the first transistor 114 is electrically connected to a second terminal 132. One of a source and a drain of the second transistor 116 is electrically connected to a high potential power supply line $V_{dd}$. The other of the source and the drain of the second transistor 116 is electrically connected to the other of the source and the drain of the first transistor 114, one of a source and a drain of the third transistor 118, and a first data holding portion 140. The other of the source and the drain of the third transistor 118 is electrically connected to a low potential power supply line $V_{ss}$. A gate of the second transistor 116 and a gate of the third transistor 118 are electrically connected to a second data holding portion 142.

One of a source and a drain of the fourth transistor 120 is electrically connected to a third terminal 134. A gate of the fourth transistor 120 is electrically connected to a fourth terminal 136. One of a source and a drain of the fifth transistor 122 is electrically connected to the high potential power supply line $V_{dd}$. The other of the source and the drain of the fifth transistor 122 is electrically connected to the other of the source and the drain of the fourth transistor 120, one of a source and a drain of the sixth transistor 124, and the second data holding portion 142. The other of the source and the drain of the sixth transistor 124 is electrically connected to the low potential power supply line $V_{ss}$. A gate of the fifth transistor 122 and a gate of the sixth transistor 124 are electrically connected to the first data holding portion 140.

The first transistor 114, the third transistor 118, the fourth transistor 120, and the sixth transistor 124 are n-channel transistors.

The second transistor 116 and the fifth transistor 122 are p-channel transistors.

The first terminal 130 is electrically connected to a bit line. The second terminal 132 is electrically connected to a first word line. The third terminal 134 is electrically connected to an inverted bit line. The fourth terminal 136 is electrically connected to the first word line.

The first memory circuit 110 having the above-described configuration is an SRAM. In other words, the first memory circuit 110 is a volatile memory. In the memory device 100, which is one embodiment of the present invention, the first data holding portion 140 and the second data holding portion 142, which are provided in the first memory circuit 110, are electrically connected to the second memory circuit 112.

The second memory circuit 112 includes a seventh transistor 126 and an eighth transistor 128.

Next, a configuration of the second memory circuit 112 is described. One of a source and a drain of the seventh transistor 126 is electrically connected to the second data holding portion 142. The other of the source and the drain of the seventh transistor 126 is electrically connected to one electrode of a first capacitor 148. The low potential power supply line $V_{ss}$ is electrically connected to the other electrode of the first capacitor 148. One of a source and a drain of the eighth transistor 128 is electrically connected to the first data holding portion 140. The other of the source and the drain of the eighth transistor 128 is electrically connected to one electrode of a second capacitor 150. The low potential power supply line $V_{ss}$ is electrically connected to the other electrode of the second capacitor 150. A gate of the seventh transistor 126 and a gate of the eighth transistor 128 are electrically connected to a fifth terminal 138.

The fifth terminal 138 is electrically connected to a second word line. Note that operation of one of the first and second word lines may control a signal of the other, or alternatively, the first word line and the second word line may each be independently controlled.

The seventh transistor 126 and the eighth transistor 128 are each a transistor having low off-state current. In the configuration illustrated in FIG. 2, the seventh transistor 126 and the eighth transistor 128 are n-channel transistors; however, one embodiment of the present invention is not limited thereto.

A third data holding portion 144 is formed between the seventh transistor 126 and the one electrode of the first capacitor 148. A fourth data holding portion 146 is formed between the eighth transistor 128 and the one electrode of the second capacitor 150. Since the seventh transistor 126 and the eighth transistor 128 each have low off-state current, charge in the third data holding portion 144 and the fourth data holding portion 146 can be held for a long period. In other words, the second memory circuit 112 is a non-volatile memory.

In each of the seventh transistor 126 and the eighth transistor 128, the off-state current per micrometer of channel width is preferably 10 aA ($1\times10^{-17}$ A) or lower. The off-state current per micrometer of channel width of each of the transistors having low off-state current is preferably 1 aA ($1\times10^{-18}$ A) or lower, further preferably 10 zA ($1\times10^{-20}$ A) or lower, still further preferably 1 zA ($1\times10^{-21}$ A) or lower, yet still further preferably 100 yA ($1\times10^{-22}$ A) or lower.

As described above, the first memory circuit 110 is a volatile memory and the second memory circuit 112 is a non-volatile memory. The first data holding portion 140 and the second data holding portion 142, which are the data holding portions in the first memory circuit 110, are electrically connected to the third data holding portion 144 and the fourth data holding portion 146, which are the data holding portions in the second memory circuit 112, through the transistors each having low off-state current. Thus, by controlling the gate potentials of the transistors each having low off-state current, the data in the first memory circuit 110 can be held also in the data holding portion of the second memory circuit 112.

In this way, in the memory element 108 illustrated in FIG. 2, data in the volatile memory can be saved in the non-volatile memory.

The first memory circuit 110 is an SRAM, and thus needs to operate at high speed. On the other hand, the second memory circuit 112 is required to hold data for a long period after supply of power is stopped. Such requirements can be satisfied by forming the first memory circuit 110 using transistors which are capable of high speed operation and forming the second memory circuit 112 using transistors which have low off-state current. For example, the first memory circuit 110 may be formed using a single crystal silicon substrate, and the second memory circuit 112 may be formed using an oxide semiconductor. For an example of such a configuration, refer to Embodiment 2. Note that one embodiment of the present invention is not limited to the above configuration.

In the memory device 100, which is one embodiment of the present invention, when the first transistor 114 and the fourth transistor 120 are turned on so that data is written to the data holding portions in the first memory circuit 110, which is a volatile memory, in the case where the seventh transistor 126 and the eighth transistor 128, which are included in the second memory circuit 112, are on, it is necessary to accumulate charge in the first capacitor 148 and the second capacitor 150, which are included in the second memory circuit 112, in order that the data holding portions (the first data holding portion 140 and the second data holding portion 142) in the first memory circuit 110 each hold a predetermined potential. Thus, the seventh transistor 126 and the eighth transistor 128 which are on when data is written to the data holding portions in the first memory circuit 110 prevent the memory element 108 from operating at high speed. In a case of the second memory circuit 112 formed using a single crystal silicon substrate, it is difficult to sufficiently reduce the off-state current and hold stored data in second memory circuit 112 for a long period.

In the semiconductor device that is one embodiment of the present invention, when data is written to the data holding portions in the first memory circuit 110 (the volatile memory), transistors (i.e., the seventh transistor 126 and the eighth transistor 128) which are positioned between the data holding portions in the first memory circuit 110 and the data holding portions in the second memory circuit 112 are turned off. In this manner, high speed operation of the memory element 108 can be achieved. Further, when neither writing nor reading to/from the data holding portions in the first memory circuit 110 is performed (that is, the first transistor 114 and the fourth transistor 120 are off), the transistors which are positioned between the data holding portions in the first memory circuit 110 and the data holding portions in the second memory circuit 112 are turned on.

A specific operation of data writing to the volatile memory in the memory element 108 is described below. First, the seventh transistor 126 and the eighth transistor 128 which are on are turned off. Next, the first transistor 114 and the fourth transistor 120 are turned on to supply a predetermined potential to the data holding portions (the first data holding portion 140 and the second data holding portion 142) in the first memory circuit 110, and then the first transistor 114 and the fourth transistor 120 are turned off. After that, the seventh transistor 126 and the eighth transistor 128 are turned on. In this manner, data corresponding to data held in the data holding portions in the first memory circuit 110 is held in the data holding portions in the second memory circuit 112.

In order that the memory device 100 operates at high speed, as described above, when the first transistor 114 and the fourth transistor 120 are turned on at least for data writing to the data holding portions in the first memory circuit 110, it is necessary to turn off the seventh transistor 126 and the eighth transistor 128, which are included in the second memory circuit 112. The seventh transistor 126 and the eighth transistor 128 may be on or off when the first transistor 114 and the fourth transistor 120 are turned on for data reading from the data holding portions in the first memory circuit 110.

While the first transistor 114 and the fourth transistor 120 are off (data holding period), the seventh transistor 126 and the eighth transistor 128 are turned on so that data is held in both the first memory circuit 110 and the second memory circuit 112.

In the case where supply of power to the memory element 108 is stopped, the transistors which are positioned between the data holding portions in the first memory circuit 110 and the data holding portions in the second memory circuit 112 (i.e., the seventh transistor 126 and the eighth transistor 128) are turned off just before supply of power to the memory element 108 is stopped, so that the data held in the second memory circuit 112 becomes non-volatile. A means for turning off the seventh transistor 126 and the eighth transistor 128 just before supply of power to the volatile memory is stopped may be mounted on the first driver circuit 104 and the second driver circuit 106, or alternatively may be provided in another control circuit for controlling these driver circuits.

Note that here, whether the seventh transistor 126 and the eighth transistor 128, which are positioned between the data holding portions in the first memory circuit 110 and the data holding portions in the second memory circuit 112, are turned on or off may be determined in each memory element or may be determined in each block in the case where the memory element portion 102 is divided into blocks.

In the memory device 100, which is one embodiment of the present invention, when data is written to the first memory circuit 110, the transistors which are positioned between the data holding portions in the first memory circuit 110 and the data holding portions in the second memory circuit 112 are turned off; accordingly, data can be written to the first memory circuit 110 without accumulation of charge in the first capacitor 148 and the second capacitor 150, which are included in the second memory circuit 112. Thus, the memory element 108 can operate at high speed.

In the memory device 100, which is one embodiment of the present invention, before supply of power to the memory device 100 is stopped (a power supply of the memory device 100 is turned off), the transistors which are positioned between the data holding portions in the first memory circuit 110 and the data holding portions in the second memory circuit 112 are turned off in all of the memory elements 108 included in the memory device 100, so that the data becomes non-volatile. In consideration of a time for holding data in the volatile memory also in the non-volatile memory, the transistors which are positioned between the data holding portions in the first memory circuit 110 and the data holding portions in the second memory circuit 112 in the memory element 108 in which data is rewritten last are preferably turned off after the transistors in the other memory elements 108 are turned off. In other words, it is preferable that only the seventh transistor 126 and the eighth transistor 128 which are included in the memory element 108 in which data is rewritten last be on and the seventh transistors 126 and the eighth transistors 128 which are included in the other memory elements 108 be turned off just before a power supply of the memory device 100 is turned off. In this case, by storing an address of the memory element 108 in which data is rewritten last in an external memory, supply of power to the other memory elements 108 can be stopped before supply of power to the memory element 108 in which data is rewritten last is stopped, which is preferable.

Note that the driving method of the semiconductor device that is one embodiment of the present invention is not limited to the above description.

As described above, the memory device 100 can operate at high speed. Since data saving is performed only by part of the memory elements, power consumption can be reduced.

In this embodiment, an SRAM is used for the volatile memory; however, one embodiment of the present invention is not limited thereto, and other volatile memories may be used.

The structures and methods described in this embodiment can be combined as appropriate with any of the structures and methods described in the other embodiments.

Embodiment 2

In this embodiment, an example of a circuit configuration of a memory element which can be applied to the above memory device 100, which is different from the circuit configuration in FIG. 2, is described with reference to drawings. Note that many portions of the configuration in this embodiment are the same as those in Embodiment 1; thus, repetitive description of portions which are the same or portions having functions which are the same as those in portions in Embodiment 1 is omitted.

Figure 5:
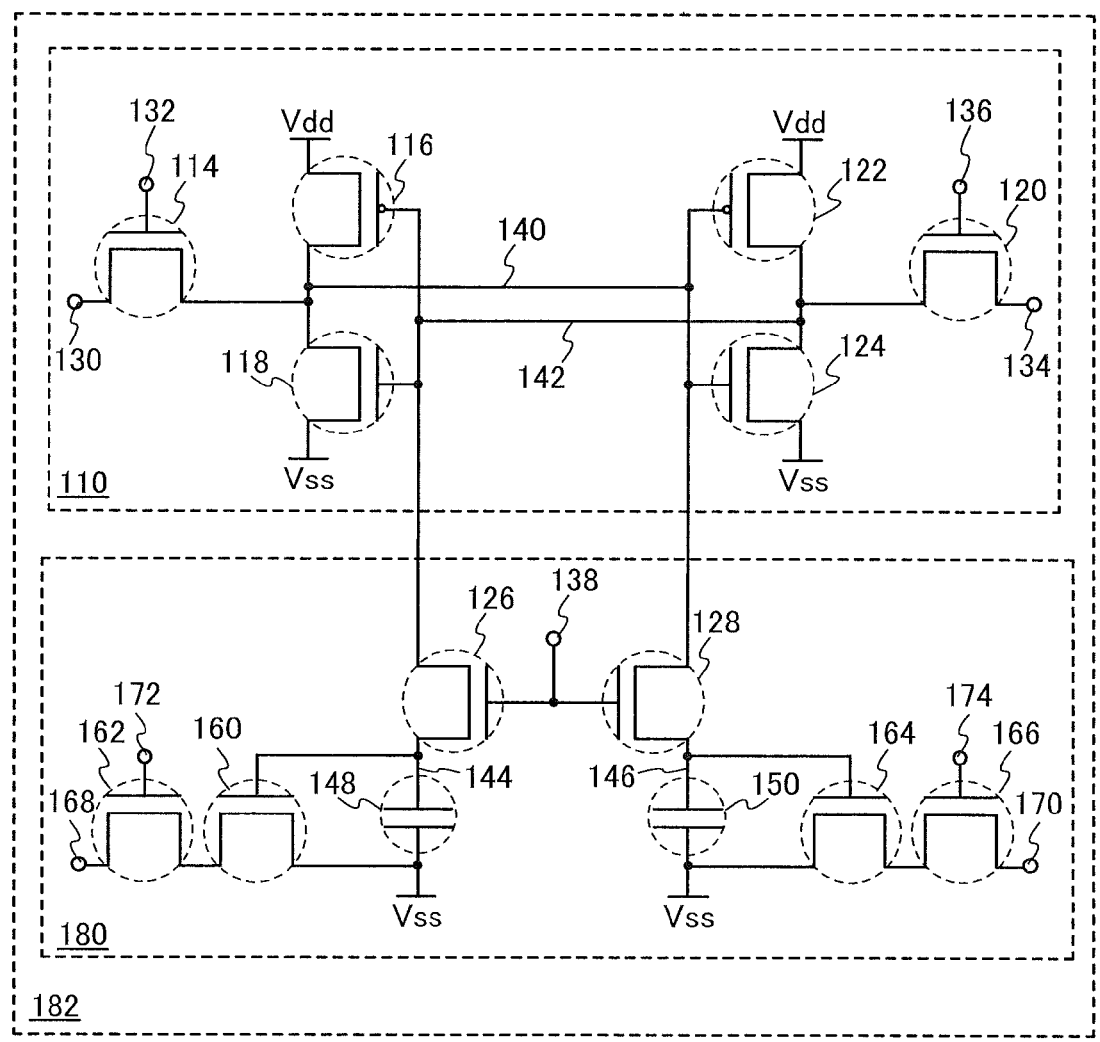
FIG. 5 is a circuit diagram illustrating a semiconductor device that is one embodiment of the present invention.

FIG. 5 is a configuration example of a memory element 182 which can be applied to the memory device 100. The memory element 182 in FIG. 5 includes the first memory circuit 110 and a second memory circuit 180.

The first memory circuit 110 of the memory element 182 in FIG. 5 can have a configuration similar to that of the first memory circuit 110 of the memory element 108 in FIG. 2.

The second memory circuit 180 includes, as well as the seventh transistor 126 and the eighth transistor 128 which are illustrated in FIG. 2, a ninth transistor 160, a tenth transistor 162, an eleventh transistor 164, and a twelfth transistor 166.

A configuration of the second memory circuit 180 is described. One of the source and the drain of the seventh transistor 126 is electrically connected to the second data holding portion 142. The other of the source and the drain of the seventh transistor 126 is electrically connected to a gate of the ninth transistor 160 and the one electrode of the first capacitor 148. The other electrode of the first capacitor 148 is electrically connected to one of a source and a drain of the ninth transistor 160 and the low potential power supply line $V_{ss}$. The other of the source and the drain of the ninth transistor 160 is electrically connected to one of a source and a drain of the tenth transistor 162. A gate of the tenth transistor 162 is electrically connected to an eighth terminal 172. The other of the source and the drain of the tenth transistor 162 is electrically connected to a sixth terminal 168.

The one of the source and the drain of the eighth transistor 128 is electrically connected to the first data holding portion 140. The other of the source and the drain of the eighth transistor 128 is electrically connected to a gate of the eleventh transistor 164 and the one electrode of the second capacitor 150. The gate of the seventh transistor 126 and the gate of the eighth transistor 128 are electrically connected to the fifth terminal 138. The other electrode of the second capacitor 150 is electrically connected to one of a source and a drain of the eleventh transistor 164 and the low potential power supply line $V_{ss}$. The other of the source and the drain of the eleventh transistor 164 is electrically connected to one of a source and a drain of the twelfth transistor 166. A gate of the twelfth transistor 166 is electrically connected to a ninth terminal 174. The other of the source and the drain of the twelfth transistor 166 is electrically connected to a seventh terminal 170.

The second terminal 132 and the fourth terminal 136 of the first memory circuit 110 are electrically connected to the first word line. The fifth terminal 138 of the second memory circuit 180 is electrically connected to the second word line. The eighth terminal 172 and the ninth terminal 174 are electrically connected to a third word line. Note that operation of any one of the first word line, the second word line, and the third word line may control a signal of one of the other word lines, or alternatively, the first word line, the second word line, and the third word line may be independently controlled. The second word line and the third word line may be a common word line.

The first terminal 130 of the first memory circuit 110 in FIG. 5 is electrically connected to a first bit line, and the third terminal 134 is electrically connected to a first inverted bit line. The sixth terminal 168 is electrically connected to a second bit line, and the seventh terminal 170 is electrically connected to a second inverted bit line. The first bit line and the second bit line may be a common bit line. The first inverted bit line and the second inverted bit line may be a common bit line.

The seventh transistor 126 and the eighth transistor 128 are each a transistor having low off-state current.

The ninth transistor 160 and the tenth transistor 162 function as a read circuit for data held in the third data holding portion 144. The eleventh transistor 164 and the twelfth transistor 166 function as a read circuit for data held in the fourth data holding portion 146. Thus, transistors which can operate at high speed are preferably applied to the ninth transistor 160, the tenth transistor 162, the eleventh transistor 164, and the twelfth transistor 166.

For example, it is preferable to manufacture the ninth transistor 160 to the twelfth transistor 166 using the same semiconductor material as the transistors included in the first memory circuit 110 and to manufacture the seventh transistor 126 and the eighth transistor 128 using an oxide semiconductor. In this case, the ninth transistor 160 to the twelfth transistor 166 are preferably manufactured in the same step as the first memory circuit 110. For example, the first memory circuit 110 and the ninth transistor 160 to the twelfth transistor 166 may be formed using a single crystal silicon substrate.

Although the transistors included in the second memory circuit 180 in FIG. 5 (the seventh transistor 126 to the twelfth transistor 166) are all n-channel transistors, one embodiment of the present invention is not limited thereto.

Read operation of data held in the second memory circuit 180 is described. The case of reading data held in the third data holding portion 144 is described here for example. Note that reading of data held in the fourth data holding portion 146 can be performed similarly. Further, the data held in the third data holding portion 144 and the data held in the fourth data holding portion 146 can be read at the same time.

First, a precharge potential is supplied to the sixth terminal 168, so that the sixth terminal 168 is precharged. The precharge potential is set higher than the potential of the low potential power supply line $V_{ss}$. For example, the precharge potential may be the potential of the high potential power supply line $V_{dd}$.

After the supply of the precharge potential to the sixth terminal 168 is stopped, the tenth transistor 162 is turned on. In the case where the data held in the third data holding portion 144 has a high potential (high or H), both the ninth transistor 160 and the tenth transistor 162 are turned on; accordingly, the potential with which the sixth terminal 168 is precharged is lowered to be the potential of the low potential power supply line $V_{ss}$. In contrast, in the case where the data held in the third data holding portion 144 has a low potential (low or L), the ninth transistor 160 is off; accordingly, the potential of the sixth terminal 168 remains the precharge potential even after the tenth transistor 162 is turned on. Thus, depending on the potential of the sixth terminal 168, data held in the third data holding portion 144 can be judged.

In the case where a read circuit is not provided in the second memory circuit 112 as in the memory element 108 illustrated in FIG. 2, read operation through the first memory circuit 110 is necessary in order to read data held in the second memory circuit 112. For example, in the case where supply of power to the memory element 108 is resumed so that the data is read, first, the seventh transistor 126 and the eighth transistor 128 are turned on while the first transistor 114 and the fourth transistor 120 remain off, whereby data held in the second memory circuit 112 is recovered in the first memory circuit 110. After the recovery of the data, the seventh transistor 126 and the eighth transistor 128 may be turned off again or may remain on. After that, power is supplied to the high potential power supply line $V_{dd}$ and the low potential power supply line $V_{ss}$ of the first memory circuit 110, and the first transistor 114 and the fourth transistor 120 are turned on, so that a potential corresponding to the data held in the second memory circuit 112 can be read from the first terminal 130 and the third terminal 134.

In the configuration in FIG. 5, the ninth transistor 160 to the twelfth transistor 166 are provided as read circuits in the second memory circuit 180, whereby data held in the second memory circuit 180 can be directly read; thus, the data held in the second memory circuit 180 can be read at high speed.

Since the data held in the second memory circuit 180 can be directly read by the read circuits, new data can be written to the first memory circuit 110 without data held in the second memory circuit 180 recovered in the first memory circuit 110 (i.e., with the second memory circuit 180 holding data). That is, different data can be held in the volatile memory and the non-volatile memory, so that the number of bits per cell can be increased to two.

Although FIG. 5 illustrates the case where two read circuits are provided, which are a read circuit which includes the ninth transistor and the tenth transistor and is configured to read the data held in the third data holding portion 144 and a read circuit which includes the eleventh transistor and the twelfth transistor and is configured to read the data held in the fourth data holding portion 146, one embodiment of the present invention is not limited thereto. In the configuration illustrated in FIG. 5, the data held in the third data holding portion 144 and the data held in the fourth data holding portion 146 are inverted to each other; thus, a read circuit may be provided in only one of the data holding portions. However, in order to read the data held in the third data holding portion 144 and the fourth data holding portion 146 with high reliability, a read circuit is preferably provided in each of the data holding portions.

Figure 6:
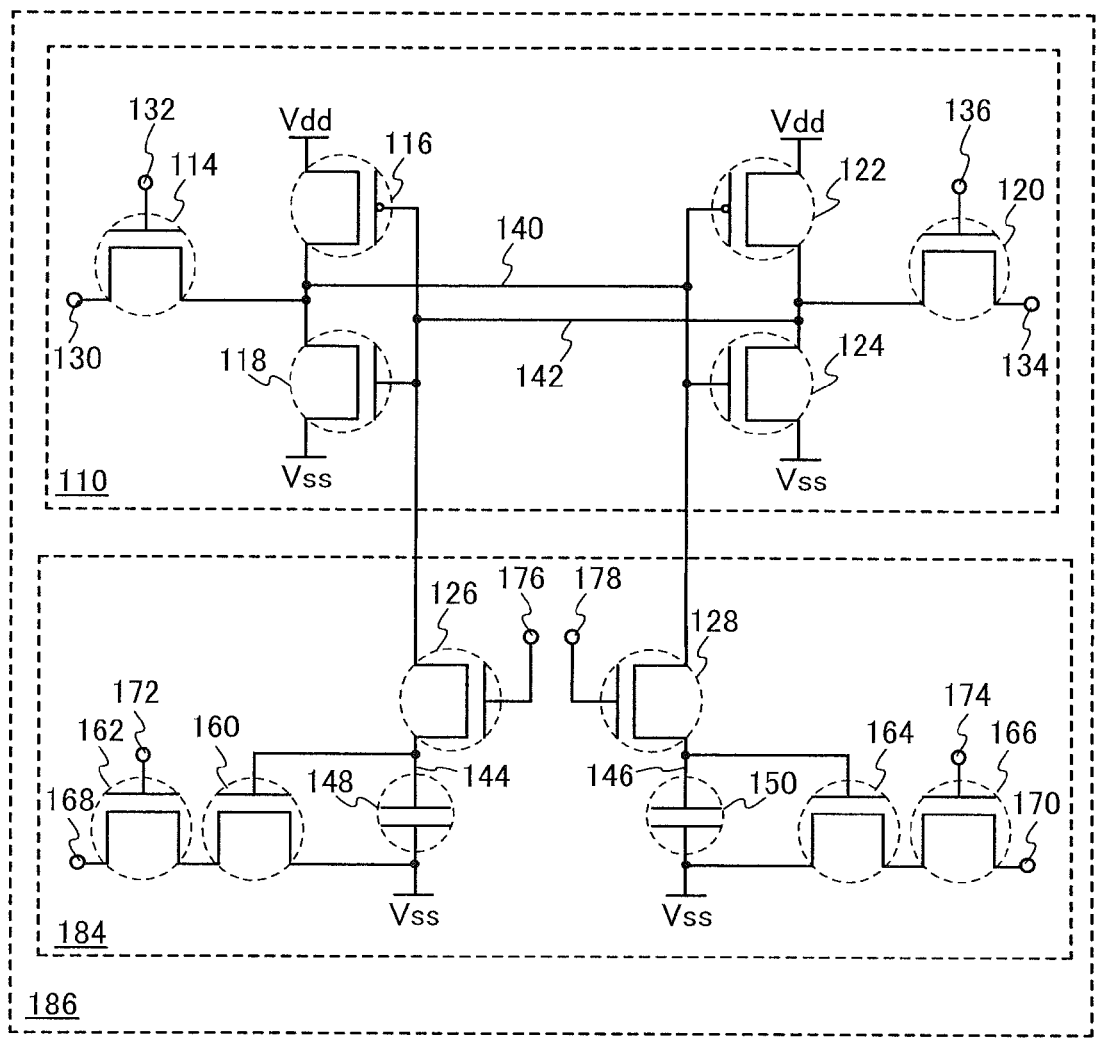
FIG. 6 is a circuit diagram illustrating a semiconductor device that is one embodiment of the present invention.

FIG. 6 illustrates a modification example of the memory element 182 illustrated in FIG. 5. A memory element 186 illustrated in FIG. 6 includes the first memory circuit 110 and a second memory circuit 184.

In the second memory circuit 184 illustrated in FIG. 6, the gate of the seventh transistor 126 is electrically connected to a tenth terminal 176, and the gate of the eighth transistor 128 is electrically connected to an eleventh terminal 178. The tenth terminal 176 and the eleventh terminal 178 are electrically connected to the second word lines. The other configurations are the same as those in FIG. 5; thus, detailed description is omitted.

In the memory element 186 illustrated in FIG. 6, since the gate of the seventh transistor 126 and the gate of the eighth transistor 128 are electrically connected to different terminals, the transistors each can operate independently. Thus, the data held in the third data holding portion 144 and the fourth data holding portion 146 are not necessarily inverted to each other. Thus, with the configuration in FIG. 6, the number of bits per cell can be increased.

The structures and methods described in this embodiment can be combined as appropriate with any of the structures and methods described in the other embodiments.

Embodiment 3

In this embodiment, an example of the structure of a semiconductor device that is one embodiment of the present invention is described.

First, examples of the structure of a transistor which has low off-state current and can be used in a semiconductor device that is one embodiment of the present invention are described with reference to schematic cross-sectional views in FIGS. 3A and 3B. Note that components illustrated in FIGS. 3A and 3B may have sizes different from the actual sizes.

Figure 3A:
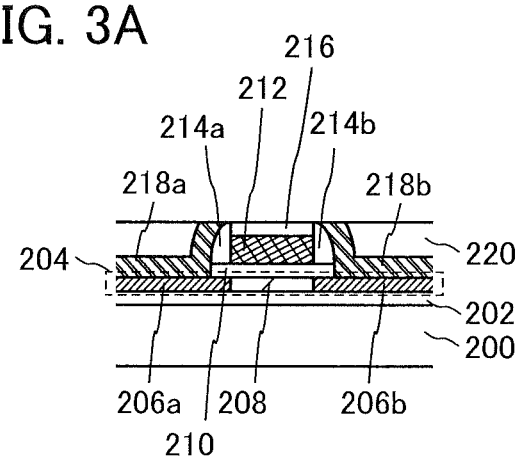
FIGS. 3A and 3B are each a cross-sectional view illustrating a semiconductor device that is one embodiment of the present invention.

The transistor illustrated in FIG. 3A includes a semiconductor layer 204, an insulating layer 210, a conductive layer 212, an insulating layer 214a, an insulating layer 214b, an insulating layer 216, a conductive layer 218a, a conductive layer 218b, and an insulating layer 220.

The semiconductor layer 204 is provided over an element formation layer 200 with an insulating layer 202 placed therebetween. Note that one embodiment of the present invention is not limited thereto, and the semiconductor layer 204 may be provided directly on the element formation layer 200.

The semiconductor layer 204 includes regions 206a and 206b to which dopants are added and a channel formation region 208 between the regions 206a and 206b.

The insulating layer 210 is provided over part of the semiconductor layer 204.

The conductive layer 212 is provided to overlap the semiconductor layer 204 with the insulating layer 210 placed therebetween.

The insulating layer 214a and 214b are sidewall insulating layers provided in contact with side surfaces of the conductive layer 212.

The insulating layer 216 is provided over the conductive layer 212.

The conductive layer 218a is provided in contact with the region 206a, and the conductive layer 218b is provided in contact with the region 206b. The conductive layer 218a is provided also in contact with a side surface of the insulating layer 214a. The conductive layer 218b is provided also in contact with a side surface of the insulating layer 214b.

The insulating layer 220 is provided over the conductive layers 218a and 218b.

The conductive layers 218a and 218b and the insulating layer 220 are formed by chemical mechanical polishing (CMP) treatment or etching treatment, for example.

Figure 3B:
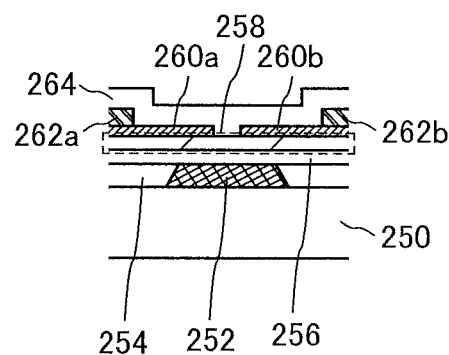

The transistor illustrated in FIG. 3B includes a conductive layer 252, an insulating layer 254, an insulating layer 256, a semiconductor layer 258, a conductive layer 260a, a conductive layer 260b, a conductive layer 262a, a conductive layer 262b, and an insulating layer 264.

The conductive layer 252 is provided over an element formation layer 250.

The insulating layer 254 is provided over the element formation layer 250. Surfaces of the conductive layer 252 and the insulating layer 254 are preferably flat.

The conductive layer 252 and the insulating layer 254 are formed by CMP treatment or etching treatment, for example.

The insulating layer 256 is provided over the conductive layer 252 and the insulating layer 254.

The semiconductor layer 258 is provided to overlap the conductive layer 252 with the insulating layer 256 placed therebetween.

The conductive layers 260a and 260b are provided in contact with the semiconductor layer 258. At this time, the distance between the conductive layers 260a and 260b, which corresponds to a channel length, is preferably less than 50 nm. The distance between the conductive layers 260a and 260b can be made less than 50 nm in such a manner that part of a conductive film is etched using a resist mask formed by electron beam exposure. The distance between the conductive layers 260a and 260b is preferably less than the distance between the conductive layers 262a and 262b as illustrated in FIG. 3B.

The conductive layer 262a is provided on and in contact with part of the conductive layer 260a, and the conductive layer 262b is provided on and in contact with part of the conductive layer 260b. The electric resistance per unit area of the conductive layers 262a and 262b is preferably lower than the electric resistance per unit area of the conductive layers 260a and 260b.

The insulating layer 264 is provided to cover the semiconductor layer 258.

Next, each component illustrated in FIGS. 3A and 3B is described. Note that each of these components may have a single layer or a stack of a plurality of layers.

The insulating layer 202 is a base layer. The insulating layer 202 may be formed using a material such as gallium oxide, silicon oxide, silicon nitride, silicon oxynitride, silicon nitride oxide, aluminum oxide, aluminum nitride, aluminum oxynitride, aluminum nitride oxide, hafnium oxide, or the like, for example.

The insulating layer 254 may be formed using a material similar to that of the insulating layer 202.

The semiconductor layers 204 and 258 are each a layer in which a channel of the transistor is formed (channel formation layer). Here, the semiconductor layer 204 in FIG. 3A and the semiconductor layer 258 in FIG. 3B are explained.

As each of the semiconductor layers 204 and 258, for example, an oxide semiconductor layer can be used.

Examples of an oxide semiconductor are a metal oxide containing zinc and at least one of indium and gallium, and the metal oxide in which gallium is partly or entirely replaced with another metal element.

As the metal oxide, an In-based metal oxide, a Zn-based metal oxide, an In—Zn-based metal oxide, or an In—Ga—Zn-based metal oxide can be used, for example. Alternatively, a metal oxide including another metal element instead of part or all of gallium in the In—Ga—Zn-based metal oxide may be used.

As the metal element, one or more elements of, for example, titanium, zirconium, hafnium, germanium, tin, lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor.

For example, when tin replaces all of gallium contained in the In—Ga—Zn-based metal oxide, an In—Sn—Zn-based metal oxide is obtained. When titanium replaces part of gallium contained in the In—Ga—Zn-based metal oxide, an In—Ti—Ga—Zn-based metal oxide is obtained.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-plane method, a peak of 2θ may also be observed at around 36°, in addition to the peak of 2θ at around 31°. The peak of 2θ at around 36° is derived from the (311) plane of a $ZnGa_2O_4$ crystal; such a peak indicates that a $ZnGa_2O_4$ crystal is included in part of the CAAC-OS film including the $InGaZnO_4$ crystal. It is preferable that in the CAAC-OS film, a peak of 2θ appear at around 31° and a peak of 2θ do not appear at around 36°.

In this specification, the trigonal and rhombohedral crystal systems are included in the hexagonal crystal system.

In a transistor using the CAAC-OS film, change in electrical characteristics due to irradiation with visible light or ultraviolet light is small. Thus, the transistor has high reliability.

Note that an oxide semiconductor layer may be a stacked film including two or more films of an amorphous oxide semiconductor layer, a microcrystalline oxide semiconductor layer, and a CAAC-OS film, for example.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has few carrier traps in some cases. Thus, the transistor including the oxide semiconductor in the channel formation region has a small variation in electrical characteristics and high reliability in some cases. A charge trapped by the carrier traps in the oxide semiconductor takes a long time to be released. The trapped charge may behave like a fixed charge. Thus, the transistor which includes the oxide semiconductor having a high density of defect states in the channel formation region has unstable electrical characteristics in some cases.

In the case where an oxide semiconductor layer is used as the semiconductor layers 204 and 258, it is preferable to perform dehydration or dehydrogenation so that impurities such as hydrogen, water, a hydroxyl group, and a hydride (also referred to as a hydrogen compound) are removed from the oxide semiconductor layer, and supply oxygen to the oxide semiconductor layer because the oxide semiconductor layer can be highly purified. For example, a layer containing oxygen is formed as the layer in contact with the oxide semiconductor layer, and heat treatment is performed; thus, the oxide semiconductor layer can be highly purified.

In addition, the oxide semiconductor layer just after its formation is preferably supersaturated with oxygen so that the proportion of oxygen is higher than that in the stoichiometric composition. For example, in the case of using sputtering, the oxide semiconductor layer is preferably deposited under the condition where the proportion of oxygen in a deposition gas is large, and particularly in an oxygen atmosphere (oxygen gas: 100%). Further, in order to sufficiently supply oxygen to supersaturate the oxide semiconductor layer with oxygen, an insulating layer containing excess oxygen ($SiO_x$ (x>2)) may be provided as the insulating layer in contact with the oxide semiconductor layer (e.g., the insulating layers 202, 210, 256, and 264).

The insulating layer containing excess oxygen is formed to contain a large amount of oxygen by adjusting the deposition condition for PCVD, a plasma sputtering method, or another sputtering method. In order to make the insulating layer contain much more excess oxygen, oxygen is added by ion implantation, ion doping, or plasma treatment. Moreover, oxygen may be added to the oxide semiconductor layer.

Further, an entrapment vacuum pump is preferably used for a sputtering apparatus in the formation of the oxide semiconductor layer. This is because the amount of moisture remaining in the deposition chamber is preferably small. Further, the sputtering apparatus may be provided with a cold trap.

The oxide semiconductor layer is preferably subjected to heat treatment at a substrate temperature higher than or equal to 350° C. and less than the strain point of a substrate, preferably at a substrate temperature ranging from 350° C. to 450° C. Heat treatment may be further performed in a later step. There is no particular limitation on a heat treatment apparatus to be used here, and an electric furnace or an a rapid thermal annealing (RTA) apparatus such as a gas rapid thermal annealing (GRTA) apparatus or a lamp rapid thermal annealing (LRTA) apparatus may be used. Heat treatment may be performed more than once.

After the heat treatment, a high-purity oxygen gas, a high-purity $N_2O$ gas, or ultra-dry air (having a dew point of −40° C. or lower, preferably −60° C. or lower) is preferably introduced in the furnace where the heat treatment has been performed while the heating temperature is being maintained or being decreased. In this case, it is preferable that the oxygen gas or the $N_2O$ gas do not contain water, hydrogen, and the like. The purity of the oxygen gas or the $N_2O$ gas which is introduced into the heat treatment apparatus is 6N or higher, further preferably 7N or higher. That is, the impurity concentration of the oxygen gas or the $N_2O$ gas is 1 ppm or lower, further preferably 0.1 ppm or lower. Through this step, oxygen is supplied to the oxide semiconductor layer, and oxygen vacancies in the oxide semiconductor layer can be suppressed. Note that the high-purity oxygen gas, high-purity $N_2O$ gas, or ultra-dry air may be introduced at the time of the above heat treatment.

The hydrogen concentration of the highly purified oxide semiconductor layer, measured by SIMS, is preferably $5\times10^{19}$ atoms/$cm^3$ or less, further preferably $5\times10^{18}$ atoms/$cm^3$ or less, still further preferably $5\times10^{17}$ atoms/$cm^3$ or less.

With the use of the highly purified oxide semiconductor, the carrier density of the oxide semiconductor layer in a field-effect transistor can be lower than $1\times10^{14}$/$cm^3$, preferably lower than $1\times10^{12}$/$cm^3$, further preferably lower than $1\times10^{11}$/$cm^3$. By reducing the carrier density in this way, the off-state current per micrometer of channel width of the field-effect transistor can be 10 aA ($1\times10^{-17}$ A) or less, preferably 1 aA ($1\times10^{-18}$ A) or less, further preferably 10 ZA ($1\times10^{-20}$ A) or less, still further preferably 1 ZA ($1\times10^{-21}$ A) or less, most preferably 100 yA ($1\times10^{-22}$ A) or less.

As the dopants contained in the regions 206a and 206b, an element of Group 13 in the periodic table (e.g., boron), an element of Group 15 in the periodic table (e.g., nitrogen, phosphorus, and arsenic), and a rare gas element (e.g., helium, argon, and xenon) can be given for example. The dopants are selected from one or more of these groups.

The insulating layers 210 and 256 each function as a gate insulating layer of the transistor. Each of the insulating layers 210 and 256 can be, for example, a layer containing a material such as gallium oxide, silicon oxide, silicon nitride, silicon oxynitride, silicon nitride oxide, aluminum oxide, aluminum nitride, aluminum oxynitride, aluminum nitride oxide, or hafnium oxide.

The conductive layers 212 and 252 each function as a gate of the transistor. Each of the insulating layers 212 and 252 can be, for example, a layer containing a metal material such as molybdenum, titanium, chromium, tantalum, magnesium, silver, tungsten, aluminum, copper, neodymium, or scandium.

Each of the insulating layers 214a, 214b, and 216 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The conductive layers 218a and 218b, the conductive layers 260a and 260b, and the conductive layers 262a and 262b each function as a source or a drain of the transistor. Each of the conductive layers 218a and 218b, the conductive layers 260a and 260b, and the conductive layers 262a and 262b can be, for example, a layer containing a conductive material such as molybdenum, titanium, chromium, tantalum, magnesium, silver, tungsten, aluminum, copper, neodymium, scandium, or ruthenium.

The insulating layers 220 and 264 each function as a protective layer. Each of the insulating layers 220 and 264 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

Figure 4:
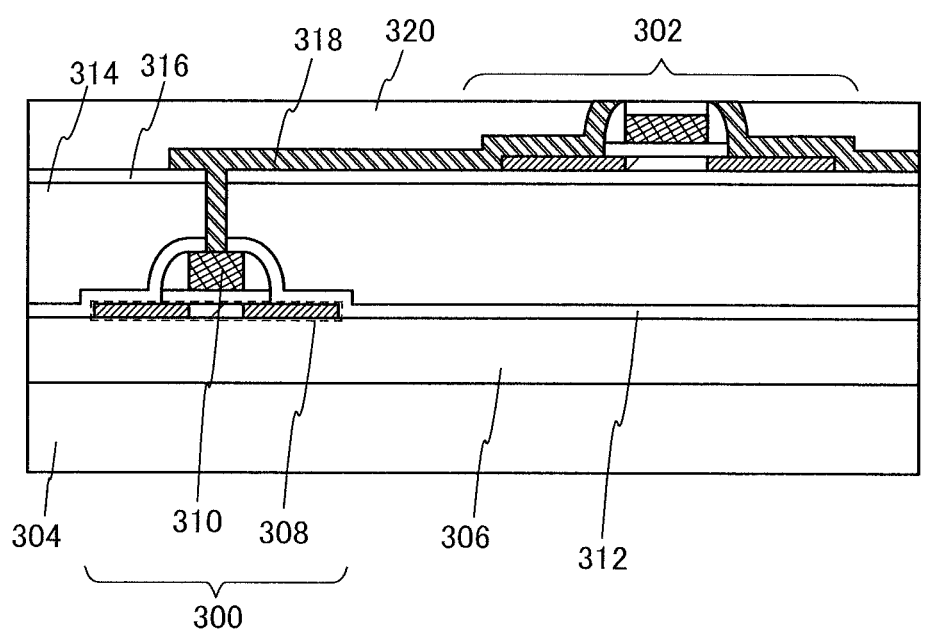
FIG. 4 is a cross-sectional view illustrating a semiconductor device that is one embodiment of the present invention.

Next, an example of the structure of a semiconductor device including the transistor illustrated in FIG. 3A is described with reference to FIG. 4. FIG. 4 is a schematic cross-sectional view illustrating an example of the structure of a semiconductor device in this embodiment.

The semiconductor device illustrated in FIG. 4 includes a transistor 300 including a single crystal silicon layer 308 that is a channel formation layer, and a transistor 302 that is stacked over the transistor 300 with insulating layers 312, 314, and 316 placed therebetween and has the structure illustrated in FIG. 3A. Further, an insulating layer 320 is provided in contact with the transistor 302.

The single crystal silicon layer 308 is provided over a substrate 304 with an insulating layer (also referred to as BOX layer) 306 placed therebetween. Note that the transistor 300 may be configured using a semiconductor region surrounded by a buried insulating region in a single crystal semiconductor substrate, instead of using the substrate 304, the insulating layer 306, and the single crystal silicon layer 308.

The insulating layer 312 functions as a protective layer. The insulating layer 314 functions both as a protective layer and as a planarization layer. The insulating layer 316 functions as a base layer. Each of the insulating layers 312, 314, and 316 can be a layer containing a material similar to that of the insulating layer 202.

A conductive layer 318 functioning as a source or a drain of the transistor 302 is connected to a conductive layer 310 functioning as a gate of the transistor 300. Note that the conductive layer 318 and the conductive layer 310 may be connected to each other through a plurality of conductive layers.

The use of the transistor with low off-state current as the transistor 302 can increase the data holding period of a memory cell.

A logic circuit (including a volatile memory circuit) such as a CPU, a signal processing circuit, or the like can be configured using the transistor 300, whereby the operation speed can be increased.

The transistor 300 in FIG. 4 corresponds to the first transistor 114, the second transistor 116, the third transistor 118, the fourth transistor 120, the fifth transistor 122, and the sixth transistor 124 which are described in Embodiment 1 with reference to FIG. 2. The transistor 302 in FIG. 4 corresponds to the seventh transistor 126 and the eighth transistor 128 which are described in Embodiment 1 with reference to FIG. 2. Thus, the conductive layer 318 in FIG. 4 functions as the first data holding portion 140 or the second data holding portion 142.

As described in this embodiment, a transistor having low off-state current can be manufactured. Note that the transistor having low off-state current is not limited to the one described in this embodiment, and is not limited to a specific configuration as long as the transistor has an off-state current small enough to hold data in a data holding portion for a required period. For example, a top-gate top-contact transistor may be used.

The structures and methods described in this embodiment can be combined as appropriate with any of the structures and methods described in the other embodiments.

Embodiment 4

The semiconductor device (memory device) according to one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can include the semiconductor device (memory device) according to one embodiment of the present invention are mobile phones, game machines including portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 7A to 7F illustrate specific examples of these electronic devices.

Figure 7A:
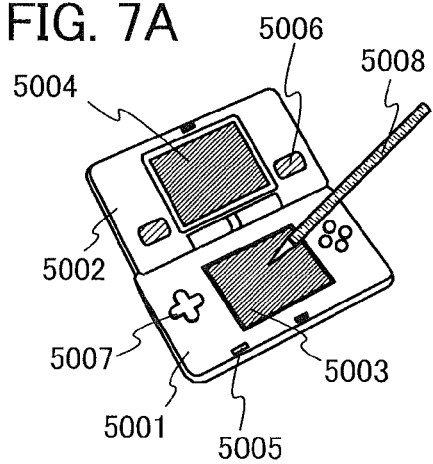
FIGS. 7A to 7F each illustrate an example of an electronic device.

FIG. 7A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 7A includes the two display portions 5003 and 5004, the number of display portions included in the portable game machine is not limited to two.

Figure 7B:
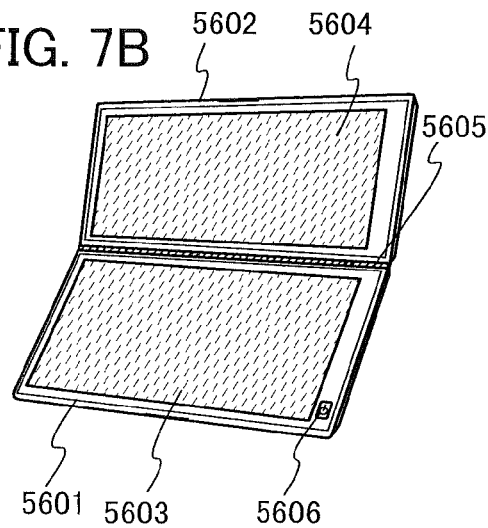

FIG. 7B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 7C:
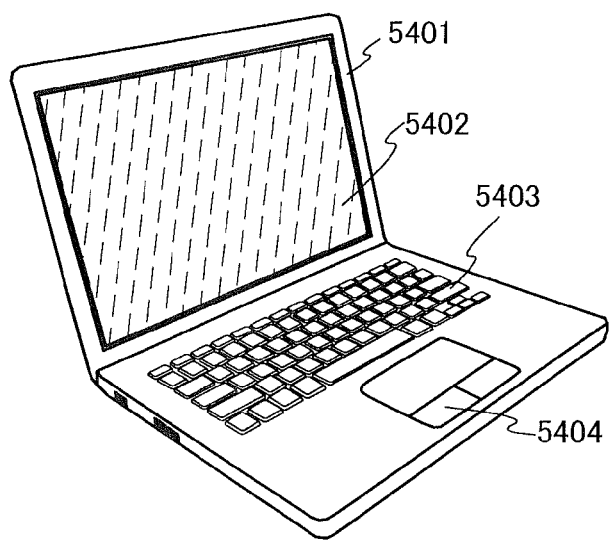

FIG. 7C illustrates a notebook personal computer, which includes a housing 5401, a display portion 5402, a keyboard 5403, a pointing device 5404, and the like.

Figure 7D:
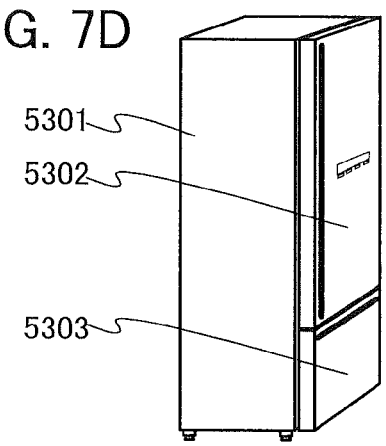

FIG. 7D illustrates an electric refrigerator-freezer, which includes a housing 5301, a door for a refrigerator 5302, a door for a freezer 5303, and the like.

Figure 7E:
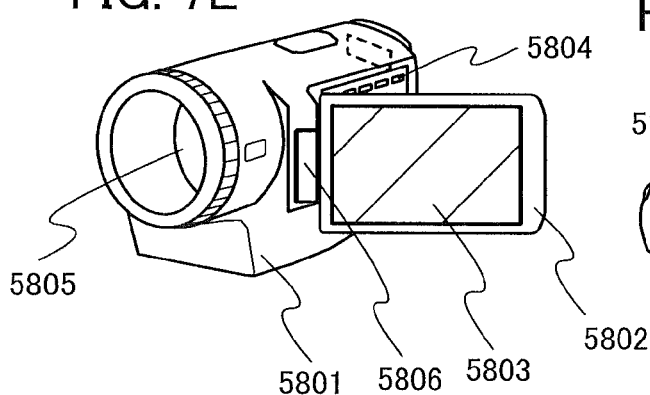

FIG. 7E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 7F:
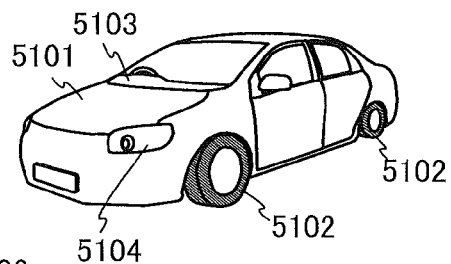

FIG. 7F illustrates an ordinary motor vehicle, which includes a car body 5101, wheels 5102, a dashboard 5103, lights 5104, and the like.

The structures and methods described in this embodiment can be combined as appropriate with any of the structures and methods described in the other embodiments.

This application is based on Japanese Patent Application serial No. 2012-109295 filed with Japan Patent Office on May 11, 2012 and Japanese Patent Application serial No. 2013-010793 filed with Japan Patent Office on Jan. 24, 2013, the entire contents of which are hereby incorporated by reference.

What is claimed is:
1. A semiconductor device comprising:
a memory element comprising:

a first memory comprising a first data holding portion and a second data holding portion; and a second memory comprising a third data holding portion and a fourth data holding portion, wherein the first data holding portion is electrically connected to a first bit line through a first transistor, wherein the second data holding portion is electrically connected to a first inverted bit line through a second transistor, wherein a first word line is electrically connected to each of a gate of the first transistor and a gate of the second transistor, wherein the third data holding portion is electrically connected to the second data holding portion through a third transistor, wherein the fourth data holding portion is electrically connected to the first data holding portion through a fourth transistor, wherein a second word line is electrically connected to each of a gate of the third transistor and a gate of the fourth transistor, wherein the third data holding portion is electrically connected to one electrode of a first capacitor, wherein the fourth data holding portion is electrically connected to one electrode of a second capacitor, wherein the other electrode of the first capacitor is electrically connected to a first power supply line, wherein the other electrode of the second capacitor is electrically connected to the first power supply line, wherein the third transistor and the fourth transistor are configured to be turned off when data is written to the first data holding portion, wherein the third transistor and the fourth transistor are configured to be turned on just after the data is written to the first data holding portion, and wherein each of the third transistor and the fourth transistor comprises an oxide semiconductor layer comprising a channel formation region comprising indium.

2. The semiconductor device according to claim 1,
wherein the first transistor and the second transistor are formed using a single crystal silicon substrate.

3. The semiconductor device according to claim 1, further comprising a fifth transistor, a sixth transistor, a seventh transistor, and an eighth transistor, wherein a gate of the fifth transistor and a gate of the sixth transistor are electrically connected to the second data holding portion, wherein one of a source and a drain of the fifth transistor is electrically connected to a second power supply line, wherein the other of a source and a drain of the fifth transistor is electrically connected to one of a source and a drain of the sixth transistor and one of a source and a drain of the first transistor, wherein the other of the source and the drain of the sixth transistor is electrically connected the first power supply line, wherein a gate of the seventh transistor and a gate of the eighth transistor are electrically connected to the first data holding portion, wherein one of a source and a drain of the seventh transistor is electrically connected to the second power supply line, wherein the other of a source and a drain of the seventh transistor is electrically connected to one of a source and a drain of the eighth transistor and one of a source and a drain of the second transistor, and wherein the other of a source and a drain of the eighth transistor is electrically connected to the first power supply line.

4. The semiconductor device according to claim 3,
wherein the fifth transistor, the sixth transistor, the seventh transistor, and the eighth transistor are formed using a single crystal silicon substrate.

5. The semiconductor device according to claim 3,
wherein the first transistor, the second transistor, the sixth transistor, and the eighth transistor are n-channel transistors, and wherein the fifth transistor and the seventh transistor are p-channel transistors.

6. The semiconductor device according to claim 1, further comprising a fifth transistor, a sixth transistor, a seventh transistor, and an eighth transistor, wherein a gate of the fifth transistor is electrically connected to one of a source and a drain of the third transistor and the one electrode of the first capacitor, wherein one of a source and a drain of the fifth transistor is electrically connected to the other electrode of the first capacitor and the first power supply line, wherein the other of a source and a drain of the fifth transistor is electrically connected to one of a source and a drain of the sixth transistor, wherein a gate of the sixth transistor is electrically connected to a third word line, wherein the other of the source and the drain of the sixth transistor is electrically connected to a second bit line, wherein a gate of the seventh transistor is electrically connected to one of a source and a drain of the fourth transistor and the one electrode of the second capacitor, wherein one of a source and a drain of the seventh transistor is electrically connected to the other electrode of the second capacitor and the first power supply line, wherein one of a source and a drain of the eighth transistor is electrically connected to the other of the source and the drain of the seventh transistor, wherein a gate of the eighth transistor is electrically connected to the third word line, and wherein the other of the source and the drain of the eighth transistor is electrically connected to a second inverted bit line.

7. The semiconductor device according to claim 1,
wherein the third transistor and the fourth transistor are configured to be turned off just before supply of power to the first memory is stopped.

8. An electronic device using the semiconductor device according to claim 1.

9. A semiconductor device comprising:
a first transistor;
a second transistor;
a third transistor;
a fourth transistor;
a fifth transistor;
a sixth transistor;
a seventh transistor; and
an eighth transistor,
wherein one of a source and a drain of the first transistor is electrically connected to a first line,
wherein the other of the source and the drain of the first transistor is electrically connected to a first node,
wherein one of a source and a drain of the second transistor is electrically connected to a second line,
wherein the other of the source and the drain of the second transistor is electrically connected to a second node, wherein one of a source and a drain of the third transistor is electrically connected to the second node, wherein one of a source and a drain of the fourth transistor is electrically connected to the first node, wherein the other of the source and the drain of the third transistor is electrically connected to an electrode of a first capacitor, wherein the other of the source and the drain of the fourth transistor is electrically connected to an electrode of a second capacitor, wherein a gate of the third transistor is electrically connected to a gate of the fourth transistor, wherein a gate of the fifth transistor is electrically connected to the second node, wherein a gate of the sixth transistor is electrically connected to the second node, wherein a gate of the seventh transistor is electrically connected to the first node, wherein a gate of the eighth transistor is electrically connected to the first node, wherein one of a source and a drain of the fifth transistor is electrically connected to the first node, wherein one of a source and a drain of the sixth transistor is electrically connected to the first node, wherein one of a source and a drain of the seventh transistor is electrically connected to the second node, wherein one of a source and a drain of the eighth transistor is electrically connected to the second node, wherein the third transistor and the fourth transistor are configured to be turned off just before the first transistor and the second transistor are turned on, wherein the third transistor and the fourth transistor are configured to be turned on just after the first transistor and the second transistor are turned off, and wherein each of the third transistor and the fourth transistor comprises an oxide semiconductor layer comprising a channel formation region comprising indium.

10. The semiconductor device according to claim 9, wherein the first transistor, the second transistor, the fifth transistor, the sixth transistor, the seventh transistor and the eighth transistor are formed using a single crystal silicon substrate.

11. The semiconductor device according to claim 10, wherein the first transistor, the second transistor, the sixth transistor, and the eighth transistor are n-channel transistors, and wherein the fifth transistor and the seventh transistor are p-channel transistors.

12. An electronic device using the semiconductor device according to claim 9.

13. A driving method for a semiconductor device, wherein the semiconductor device comprising a first transistor, a second transistor, a third transistor, a fourth transistor, a fifth transistor, a sixth transistor, a seventh transistor and an eighth transistor, wherein one of a source and a drain of the first transistor is electrically connected to a first line, wherein the other of the source and the drain of the first transistor is electrically connected to a first node, wherein one of a source and a drain of the second transistor is electrically connected to a second line, wherein the other of the source and the drain of the second transistor is electrically connected to a second node, wherein one of a source and a drain of the third transistor is electrically connected to the second node, wherein one of a source and a drain of the fourth transistor is electrically connected to the first node, wherein the other of the source and the drain of the third transistor is electrically connected to an electrode of a first capacitor, wherein the other of the source and the drain of the fourth transistor is electrically connected to an electrode of a second capacitor, wherein a gate of the third transistor is electrically connected to a gate of the fourth transistor, wherein a gate of the fifth transistor is electrically connected to the second node, wherein a gate of the sixth transistor is electrically connected to the second node, wherein a gate of the seventh transistor is electrically connected to the first node, wherein a gate of the eighth transistor is electrically connected to the first node, wherein one of a source and a drain of the fifth transistor is electrically connected to the first node, wherein one of a source and a drain of the sixth transistor is electrically connected to the first node, wherein one of a source and a drain of the seventh transistor is electrically connected to the second node, and wherein one of a source and a drain of the eighth transistor is electrically connected to the second node, the driving method comprising the steps of:

turning off the third transistor and the fourth transistor just before turning on the first transistor and the second transistor; and turning on the third transistor and the fourth transistor just after turning off the first transistor and the second transistor.

14. The driving method according to claim 13, wherein each of the third transistor and the fourth transistor comprises an oxide semiconductor layer comprising a channel formation region comprising indium.

* * * * *